United States Patent
Chakrabarti et al.

(10) Patent No.: US 6,489,659 B2
(45) Date of Patent: Dec. 3, 2002

(54) NON-HERMETIC APD

(75) Inventors: Utpal Kumar Chakrabarti, Allentown, PA (US); Robert Benedict Comizzoli, Belle Mead, NJ (US); John William Osenbach, Kutztown, PA (US); Christopher Theis, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/557,015

(22) Filed: Apr. 20, 2000

(65) Prior Publication Data

US 2002/0104989 A1 Aug. 8, 2002

(51) Int. Cl.$^7$ .............................. H01L 31/06
(52) U.S. Cl. ............... 257/460; 257/461; 257/438; 257/447; 438/48; 438/91
(58) Field of Search .................. 257/186, 438, 257/447, 460, 461, 21, 635, 637, 640, 642; 438/48, 91, 199, 380, 724, 725, 82

(56) References Cited

U.S. PATENT DOCUMENTS

| | | | | |
|---|---|---|---|---|
| 4,876,209 A | * | 10/1989 | Forrest | 437/5 |
| 4,894,703 A | | 1/1990 | Hamamsy et al. | 357/30 |
| 5,214,276 A | * | 5/1993 | Himoto et al. | 250/214.1 |
| 5,802,091 A | | 9/1998 | Chakrabarti et al. | 372/49 |
| 5,925,931 A | * | 7/1999 | Yamamoto | 257/737 |

OTHER PUBLICATIONS

Taguchi et al., "Planar–Structure INP/InGaAsP/InGaAs Avalanche Photodiodes with preferential lateral extended guard ring for 1.0–1.6 um wavelength optical communication use", J. of Lightwave Tech., vol. 6, No. 11, Nov. 1988, pp 1643–1655.*

J. W. Osenbach et al., *Behavior of a SiN:H and SiON:H Films in Condensed Water*, J. Electrochem. Soc., vol. 139, No. 11, pp. 3346–3351 (Nov. 1992).

J. W. Osenbach, *Water–Induced Corrosion of Materials Used for Semiconductor Passivation*, J. Electrochem. Soc., vol. 140, No. 12, pp. 3667–3675 (Dec. 1993).

J. W. Osenbach et al., *Time–Dependent Breakdown in Amorphous Silicon Nitride*, Proc. of the Third International Symposium on Corrosion and Reliability of Electronic Materials and Devices, Edited by R. B. Comizzoli et al., vol. 94–29, pp. 286–292 (1994).

J. W. Osenbach et al., *Temperature–Humidity–Bias–Behavior and Acceleration Model for InP Planar PIN Photodiodes*, J. Lightwave Tech., vol. 14, No.8, pp. 1865–1881 (Aug. 1996).

* cited by examiner

Primary Examiner—Steven Loke
Assistant Examiner—Donghee Kang
(74) Attorney, Agent, or Firm—Michael J. Urbano

(57) ABSTRACT

A non-hermetic APD for operation in a moisture-containing ambient comprises an InP/InGaAsP-containing Group III-V compound semiconductor body and a p-n junction formed in the body. Typically the junction intersects a top surface of the body. A patterned dielectric layer is formed on the surface so as to cover at least those regions of the surface that are intersected by the junction. An electrode is formed in an opening in the dielectric layer so as to make electrical contact with one side of the junction. Importantly, the thickness of the dielectric layer is sufficient to reduce the leakage current through it to less than about 1 nA when the operating voltage is in the range of about 20–100 V. In accordance with a preferred embodiment, the thickness of the dielectric layer is greater than about 2 $\mu$m when the applied voltage is in excess of about 20 V. Moreover, the composition of dielectric layer may be either inorganic (e.g., a silicon nitride) or a combination of inorganic and organic materials.

7 Claims, 4 Drawing Sheets

NON-HERMETIC APD

FIELD OF THE INVENTION

This invention relates generally to photodetectors and, more particularly, to avalanche photodiodes (APDs).

BACKGROUND OF THE INVENTION

In a typical back-illuminated APD formed in a Group III–V compound semiconductor body, a light (or radiation) input signal to be detected is directed toward the substrate or bottom side of the body through the opening in an annular contact. This signal, which illustratively has a wavelength in the range of about 1.1–1.7 μm, is absorbed in an InGaAs layer where photocarriers (electron-hole pairs) are generated. Under the influence of an applied voltage the holes drift toward a p-n junction that is located near to and intersects the top surface of the body. In the junction region avalanche multiplication takes place. This multiplication provides for amplification of the input signal. As a result, the receiver using an APD can detect significantly lower optical power signals than a photodetector that does not have an amplification region. The improvement in detection limit is proportional to the amount of multiplication M taking place. The multiplication, in turn, is proportional to the applied voltage. Typically voltages in the range of about 20–100 V are required depending on the desired M and the particular device geometry. The arrival rate of the multiplied carriers (i.e., amplified current), which are collected at a $p^{++}$-type electrode on the passivated p-side of the junction, is proportional to the intensity of the incident signal and the applied voltage.

The passivation is provided by a relatively thin dielectric (e.g., silicon nitride) layer (or pair of layers). An opening is etched in the nitride layer to expose the underlying, top surface of the p-n junction region, and metal is deposited in the opening so as to form the $p^{++}$-type electrode and thereby make electrical contact to the p-side of the junction. This electrode, which is typically circular, also serves as a bonding pad.

The nitride layer is typically made as thin as possible consistent with its passivation function. Illustratively, a single nitride layer about 0.2 μm thick is used. Although thicker single layers are possible, they are typically avoided because thicker layers require longer processing time, and single layers thicker than about 0.4 μm tend to crack. To avoid cracking thicker single layers can be fabricated if the passivation process is changed, but known process alternatives can lead to less than adequate passivation properties. Finally, the cracking problem can be circumvented by forming the thick nitride layer as a composite of thinner nitride layers, but once again such a process would increase cost without any apparent performance benefit.

We have found that this type of APD has poor reliability in a non-hermetic (i.e., moisture-containing) environment. Yet, there is a need in the optical components art, particularly those intended for low cost applications, for an APD that can operate reliably in non-hermetic environments. Because the packaging of such an APD would not require a hermetically sealed enclosure, it would allow for easier access to the APD and thus would facilitate optical alignment of the APD to other devices (e.g., optical fibers), thereby reducing cost of assembly. Cost would be further reduced and yields improved because the APD package would not have to meet or be tested for strict hermeticity requirements (e.g., a typical hermetic enclosure must have a package leak rate of less than about $10^{-8}$ atm/cm$^{-2}$-sec.).

SUMMARY OF THE INVENTION

We have discovered the failure mechanism responsible for the poor reliability of such APDs in non-hermetic environments. More specifically, the relatively high voltages applied to the APD in combination with the presence of a moisture-containing ambient (i.e., water vapor, humidity) lead to significant electric fields across the silicon nitride passivation layer, especially where the p-n junction intersects the top surface of the semiconductor body. The relatively high electric field across the nitride layer causes leakage current to flow through it. In the presence of a moisture-containing ambient and sufficient current, the nitride layer oxidizes. Eventually the nitride layer is breached by the oxidation process, thereby exposing portions of the top surface of the underlying semiconductor body to the moisture-containing ambient and to the relatively high electric fields. Once exposed, the semiconductor rapidly oxidizes and the device fails. In addition, we have found that the presence of electrostrictive forces can increase the susceptibility of the device to degradation in moist environments even at relatively low RH depending on the position of the wire bond relative to the p-side contact and the nitride surface.

In accordance with one aspect of our invention, this reliability problem is addressed in a non-hermetic APD that comprises an InP/InGaAsP-containing Group III–V compound semiconductor body and a p-n junction formed in the body. Typically the junction intersects a top surface of the body. A patterned dielectric layer is formed on the surface so as to cover at least those regions of the surface that are intersected by the junction. An electrode is formed in an opening in the dielectric layer so as to make electrical contact with one side of the junction. Importantly, the thickness of the dielectric layer is sufficient to reduce the leakage current through it to less than about 1 nA when the operating voltage is in the range of about 20–100 V. In accordance with a preferred embodiment, the thickness of the dielectric layer is greater than about 2 μm when the applied voltage is in excess of about 20 V. Moreover, the composition of the dielectric layer may be either inorganic (e.g., a silicon nitride) or a combination of inorganic and organic materials.

BRIEF DESCRIPTION OF THE DRAWING

Our invention, together with its various features and advantages, can be readily understood from the following more detailed description taken in conjunction with the accompanying drawing, in which.

Figure 1:
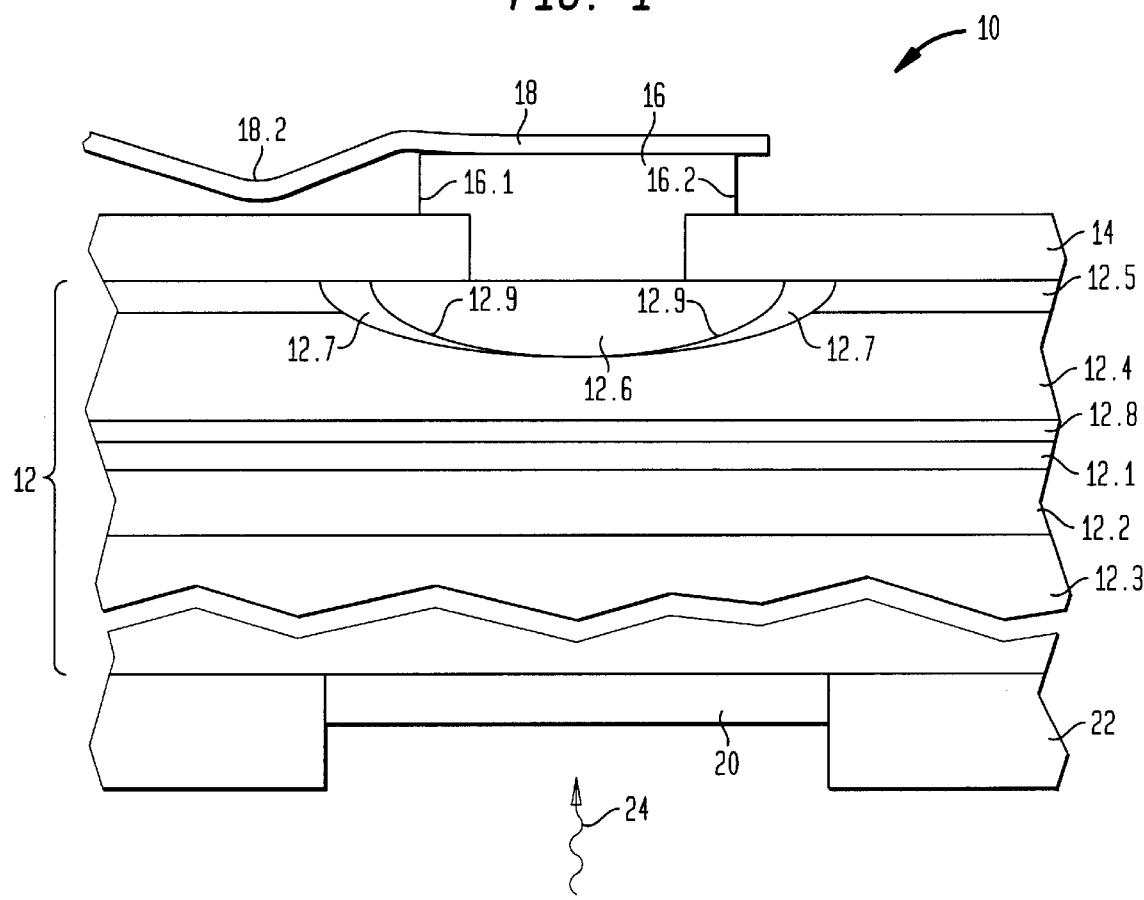
FIG. 1 is a schematic, cross-sectional view of an APD.
Figure 2:
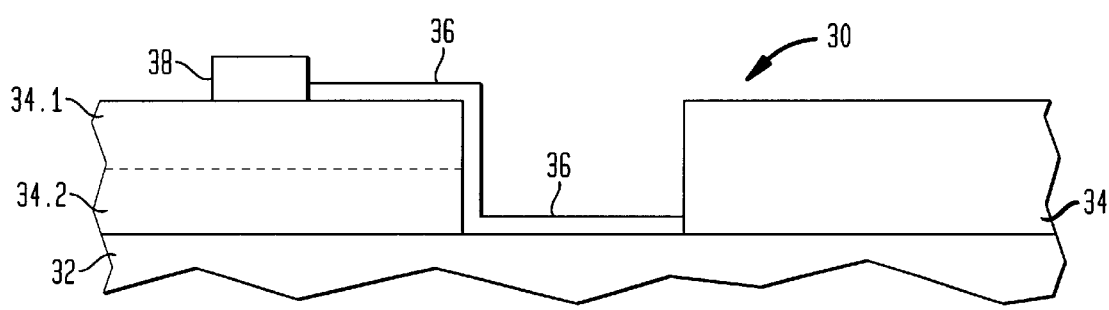
FIG. 2 a is schematic, cross-sectional view of the top portion an APD in accordance with one embodiment of our invention.
Figure 6:
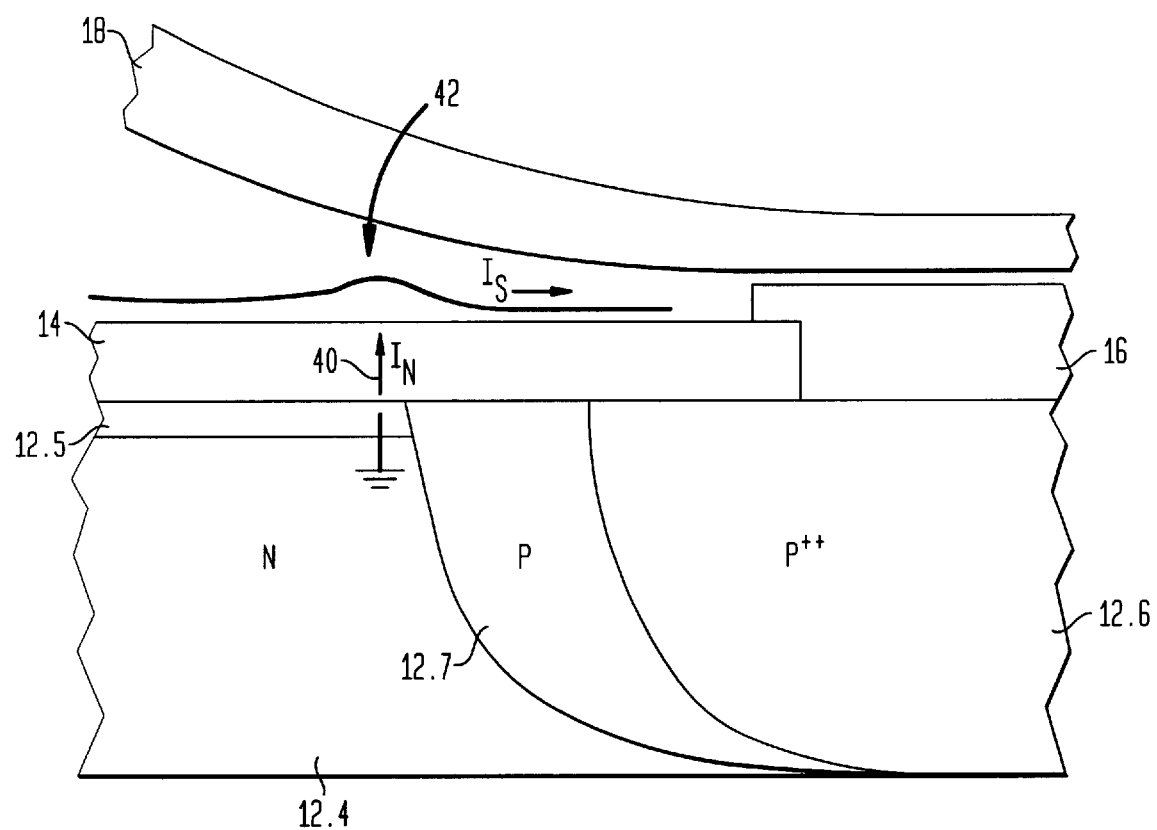
FIG. 6 is a schematic of an APD showing a bulge produced in an adsorbed water film by electrostriction.

In the interest of clarity and simplicity, the FIGS. 1, 2 and 6 have not been drawn to scale. In addition, when describing physical or optical dimensions, the symbol A stands for Angstroms, whereas when describing electric current, it stands for Amperes.

DETAILED DESCRIPTION OF THE INVENTION

General APD Considerations

With reference now to FIG. 1, an APD 10 comprises a semiconductor body 12 that includes a light absorption region 12.1 buried beneath the top surface of the body, and a p-n junction 12.9 near to and typically intersecting the top surface. Electrodes 18 and 22 are disposed on opposite sides of the device for two purposes: first to apply a reverse bias voltage across the body 12 and hence the junction 12.9, and second to collect the photocurrent that flows when a light (or radiation) signal 24 is absorbed in the region 12.1. The absorbed light generates photocarriers (i.e., electron-hole pairs) in region 12.1. Under the influence of the electric field across the body 12, one carrier type drifts toward the junction 12.9, where avalanche multiplication takes place, whereas the other carrier type drifts toward the opposite side of the device. Thus, the photocurrent is amplified, making the APD particularly suited to detecting low intensity light signals.

The APD illustrated in FIG. 1 is known as a back-illuminated device; that is, the light signal 24 enters the device through the substrate (or bottom) side of the device. In this regard, the bottom electrode 22, which is typically annular, has an opening in which an anti-reflection (AR) coating 20 is disposed. The light signal 24 made incident on the AR coating propagates into the body 12 and is absorbed by the light absorption region 12.1. To this end, the wavelength corresponding to the bandgap of the absorption region 12.1 should be higher than the wavelength of the light signal 24.

On the other hand, the top electrode 16 is disposed in an opening formed in a dielectric layer 14 so as to make electrical contact to the p-n junction 12.9. This electrode also serves as a bonding pad for a wire 18 (often referred to as a wire bond). The p-n junction is formed at the interface between a region 12.6 of a first conductivity type and a region 12.4 of a second conductivity type. Illustratively, the region 12.6 is a diffused $p^{30}$-type region, and the region 12.4 is an n-type epitaxial layer. A p-type guard ring 12.7 is preferably disposed adjacent the lateral portions of the junction.

Illustratively, the APD 10 is designed to detect optical signals having wavelengths in the range of about 1.1–1.7 $\mu$m, which are typical of many telecommunication system applications. At these wavelengths efficient conversion of light to electricity is achieved by making the semiconductor body 12 from the InP/InGaAsP material system. More specifically, the following layers are sequentially, epitaxially grown on an n-type InP substrate 12.3: an n-type InP buffer layer 12.2, an undoped InGaAs light absorption layer 12.1, an n-type InGaAsP layer 12.8, a relatively thick $n^-$-type InP region 12.4, and a thinner n-type InGaAsP cap layer 12.5.

The term undoped as used herein means that a semiconductor region is not intentionally doped; that is, any residual doping in such a layer or region is at relatively low levels and typically results from dopant species found in the background of the epitaxial chamber used to grow the layer or region. The term region is intended to include a segment of a layer, a complete single layer, or multiple layers.

The p-n junction 12.9 is formed by diffusing $p^+$-type region 12.6 into the n-type cap layer 12.5 and into $n^-$-type InP region 12.4. Region 12.6 is laterally surrounded by a p-type guard ring 12.7 that is also diffused into the cap layer 12.5 and the region 12.4. The guard ring, as is well known in the art, serves to reduce surface electric fields and surface leakage current. The cap layer,also serves to reduce surface electric fields.

The p-side electrode 16 to this type of APD is deposited through an opening in dielectric layer 14, typically silicon nitride, that exposes the top surface of body 12, in particular the top surface of p-type region 12.6. Illustratively, electrode 16 includes two parts: a thin Be/Au layer (not shown) that is deposited on and alloyed with the exposed portion of region 12.6; and a Ti/Pt/Au T-shaped plug that is deposited on the Be/Au layer and over edge portions of the nitride layer 14 adjacent the opening therein. A wire 18 is bonded to the electrode (bonding pad) 16.

In operation, when a reverse bias voltage of about 20–100 V, typically 30–80 V, is applied across electrodes 16 and 22, and a light signal 24 having a wavelength of about 1.1–1.7 $\mu$m is made incident on AR coating 20, an amplified photocurrent flows between the electrodes, with the gain being higher at higher applied voltages within the given range.

Reliability Considerations

When APDs of the type described above are enclosed in hermetic packages, their reliability is extremely good. Although hemeticity is appropriate for some applications, the relatively high cost attendant the use of a hermetic package prevents significant cost reduction that users continually demand. This problem is especially troublesome for low cost applications such as data communications and Internet services. On the other hand, exposing the APDs to a non-hermetic, moisture-containing ambient (MCA) has to date resulted in poor device reliability. The term moisture is intended to include water and water vapor. We have discovered the failure mechanisms that are responsible for this lack of reliability in moist environments. First, the relatively high voltages applied to the APD in combination with exposure to an MCA lead to significant electric fields across the silicon nitride layer 14, especially where the p-n junction intersects the top surface of the semiconductor body 12. Second, the relatively high electric field across the nitride layer causes leakage current to flow through it. The combination of a MCA and current flow through the nitride layer leads to electrochemical oxidation of the layer. Third, the nitride oxidation process forms high stress regions that lead to cracks in the nitride layer, and eventually one or more of those cracks expose the underlying, top surface of semiconductor body 12 to the MCA. Fourth, these cracks, in turn, expose the body 12 to relatively high electric fields. Fifth, this exposure of body 12 to the MCA and to high fields leads to rapid oxidation of the semiconductor. Finally, this oxidation leads to device failure. In addition, electrostrictive forces may increase the oxidation rate, and hence accelerate device failure, depending on the position of the wire 18 relative to the top surface of the nitride layer 14.

We have performed a series of experiments to verify these failure mechanisms in non-hermetic APDs. Following standard electrical tests (e.g., to measure leakage current and I–V characteristics), the APD samples were placed into sockets with ten devices per circuit board. The circuit boards were inserted into racks in a relative humidity (RH) chamber. The p-type electrode (bonding pad) 16 of each device was connected to a power supply, and the substrate-side electrode 22 was grounded. A 100 kΩ load resistor was connected between the substrate electrode 22 of each APD and ground. A connection was made to each resistor and brought out of the RH chamber so that the voltage on the load resistor, and hence the leakage current through the APD, could be monitored. (No photocurrent flowed in the APDs inasmuch as they had no light signals applied to them.)

Nine cells of twenty devices each with a variety of temperatures (ranging from 60–90° C.). RHs (ranging from 25–85%) and reverse bias voltages (ranging from 30–70 V) were used in our experiments. After loading the APDs into the RH chamber, the temperature of the chamber was increased gradually to the desired value while holding the RH at about 30%. Then, the RH was slowly increased to the desired value. After the chamber reached steady state at the desired conditions, several hours were allowed to lapse before the bias voltage was applied in order to prevent condensation on the samples. Similar procedures were followed in reverse order before removing any samples from the chamber. Aging time was measured from the time that the bias voltage was applied.

Voltage measurements were done once per day for the first five days, and at least twice per week for the next three weeks of aging. After that, the voltage was monitored at least once per week. At certain times the devices were removed from the circuit boards and visually inspected. At these times electrically failed devices were not returned to the RH chamber. The good devices were reinserted into the circuit boards and returned to the humidity chambers for continued aging. Following failure, devices were examined with an optical microscope and a scanning electron microscope. The latter was equipped with an energy dispersive x-ray analyzer (EDX) in order to determine elemental compositions. Failure was defined as a 10×increase in voltage, representing increased leakage current, or a 2×decrease in voltage, representing an open circuit condition.

Figure 3:
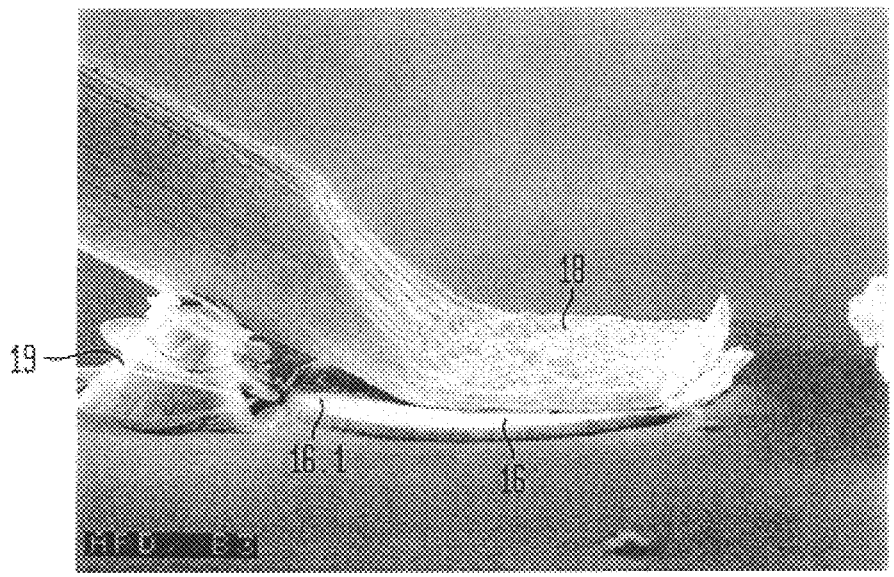
FIG. 3 is a scanning electron micrograph (SEM) of an APD that was tested at 60 ° C., 85% RH and 70 V. Corrosion is seen at the heel of the wire bond. The device failed after 149 hr. of operarion.

The filed APDs exhibited several features, forms of corrosion product, that we have termed heel, toe and halo corrosion. The term corrosion product is intended to include primarily oxidized forms of the semiconductor body 12 (e.g., oxidized In, Ga, As and P, or any sub-combination of them), but it may also include constituents of the oxidized nitride layer (e.g., Si, Nor both). As shown in FIG. 3, heel corrosion product 19 was found near the edge 16.1 of the bond pad 16 and under the wire 18. As shown n FIG. 4, toe corrosion product 21 was found at the opposite edge 16.2 of the bond pad 16 but not under the wire 18. Heel and toe corrosion appeared to originate at the p-n junction 12.9 (FIG. 1). In contrast, as shown in FIG. 5, halo corrosion product 23 frequently had the shape of a ring that was concentric with the circular bond pad 16 and surrounded a region 23.1 that was free of corrosion. As with heel and toe corrosion, the halo or ring appeared to be located over the p-n junction.

More specifically, FIG. 3 is an SEM of an APD that failed after 149 hours of aging at 60° C., 85% RH and 70 V. The SEM shows a relatively large area of heel corrosion product 19 that grew from the surface of semiconductor body 12 toward the wire 18. When the growing corrosion product 19 contacted the wire 18, a short circuit occurred and the device failed. Circular sections of what appears to be silicon nitride were embedded in the corrosion product. We believe that as the corrosion product grew, it fractured the sections of the nitride layer and lifted the sections up. Note, although the slope of wire 18 in the schematic of FIG. 1 seems to be opposite to that in the SEM of FIG. 3, in reality they would be the same. The apparent disparity is due to the orientation of the device in the SEM. In addition, the actual slope in a device may vary slightly due to unavoidable process variations.

Figure 4:
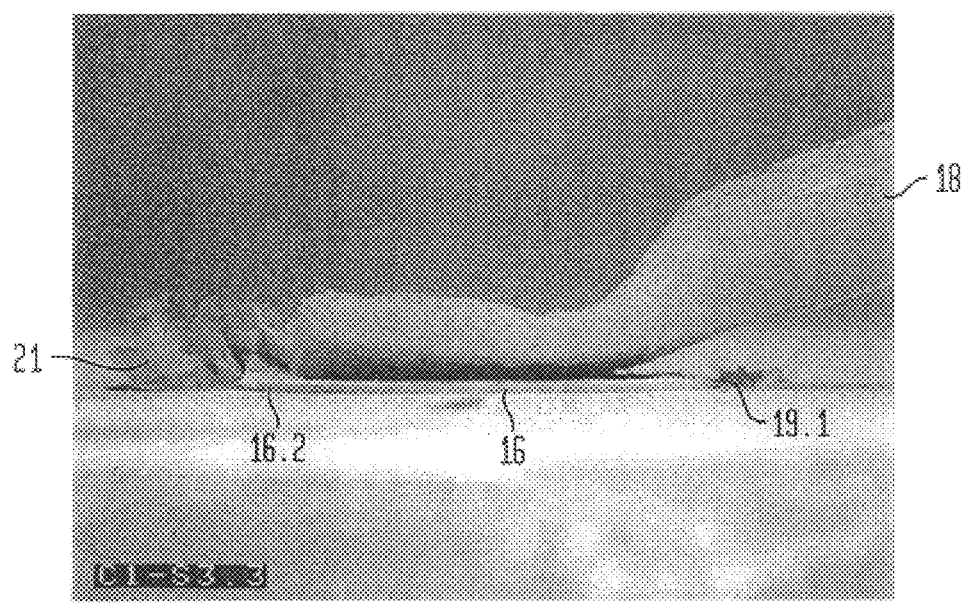
FIG. 4 is an SEM of an APD that was tested at 60° C. , 60% RH and 70 V. Corrosion is seen at the toe of the wire bond. The device failed after 456 hr. of operation.
Figure 5:
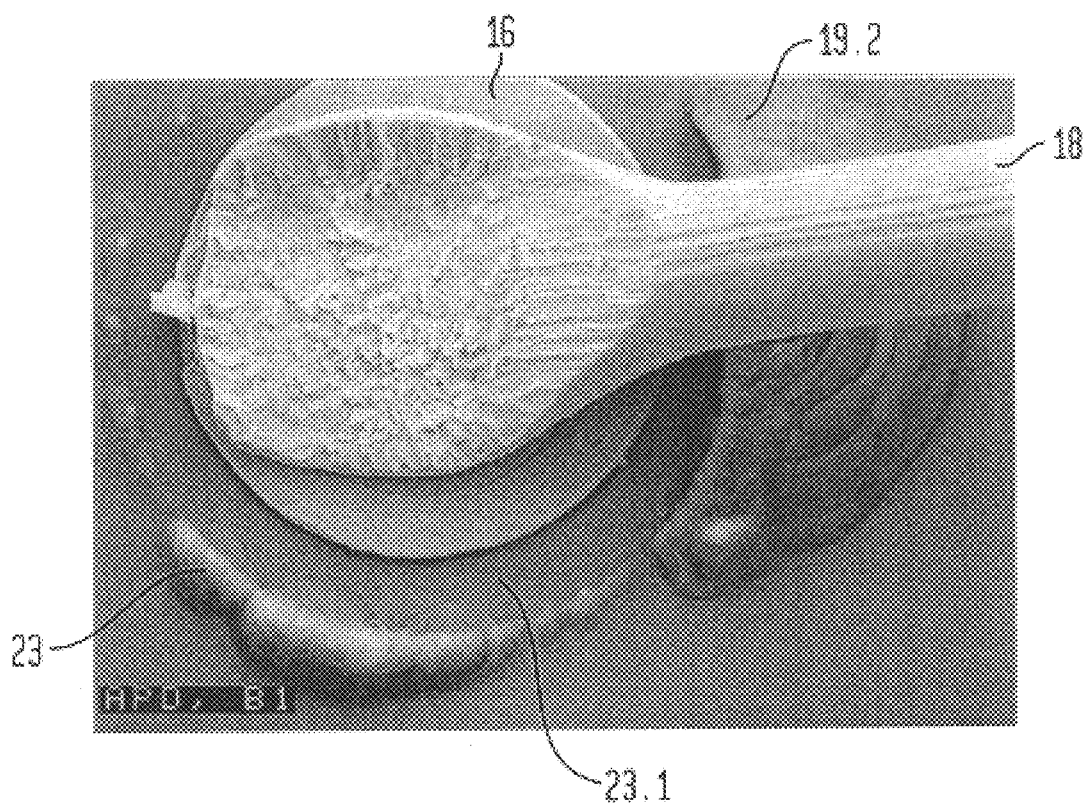
FIG. 5 is an SEM of an APD that was tested at 60° C., 85% RH and 70 V. The SEM shows both halo and heel corrosion near the wire bond. The device failed after 53 hr. of operation.

Similarly, FIG. 4 is an SEM of an APD that failed after 456 hours of aging at 60° C., 85% RH and 70 V. The SEM shows some heel corrosion product 19.1 and a much larger area of toe corrosion product 21. The heel corrosion product 19.1 was spaced from the bond pad 16, as in the device of FIG. 3, but the toe corrosion product 21 was not. That is, the latter grew over the edge 16.2 of the bond pad, thereby producing a short circuit.

Finally, FIG. 5 is an SEM of an APD that failed after 53 hours of aging at 60° C, 85% RH and 70 V. The SEM shows pronounced toe corrosion product 23 as well as some heel corrosion product 19.2. Measurement of the diameter of the halo shows that it coincides with the location of the circular p-n junction. Examination of all devices aged at 60% RH or greater revealed that the halo effect was present in all cases. On the other hand, devices aged at 25% and 40% RH exhibited heel and toe corrosion, but no halo corrosion. In many cases at 25% and 40% RH we observed mechanical damage to the bond pad.

Failure Mechanism Theory

Our investigations lead us to conclude that the failure mechanism of these non-hermetic APDs is a corrosive electrolytic process that is accelerated by voltage and the presence of a MCA. The fact that halo corrosion occurred only at the p-n junction indicates that the electric field in the silicon nitride layer is an important factor. Based on these ideas we have developed a simple model that explains the results of halo corrosion. Modifications of the simple model are then invoked to explain heel and toe corrosion.

During the incubation stage the nitride layer is being oxidized at the location where leakage current IN (in excess of about 1 nA) flows from the n-type cap layer 12.5 to the surface of the nitride layer, as indicated by the upward arrow 40 in FIG. 6. This initial stage of the failure process takes much longer than the later stage, which coincides with the corrosion process. The nitride oxidation takes longer because the nitride is a good insulator, which limits the current needed for the oxidation. A substantial fraction of the voltage drop is across the thickness of the nitride layer, especially at relatively high RH values that tend to reduce the surface resistance of the nitride. During oxidation of the nitride, the chemical structure of the layer is drastically altered so that it cracks locally at the point where oxidation is taking place. This disruption of the nitride layer exposes more nitride to oxidation, and gradually the disrupted region penetrates to the top surface of the n-type cap layer 12.5. At this time the semiconductor begins to corrode, a process that is much more rapid than the nitride oxidation since there is no insulator to impede current flow. When this breach of the nitride-semiconductor interface occurs, a much larger current Is flows (e.g., more than an order of magnitude larger than 1 nA) from the semiconductor across the unoxidized portion of the top surface of nitride to the bond pad 16. Most of the voltage in this case is along the top surface of the nitride layer. When the corrosion product resulting from the semiconductor corrosion contacts the wire 18, a short circuit results. Disruption of the p-n junction by the corrosion process (i.e., a corroded region that bridges the junction) may also cause high leakage currents. In addition, if the corrosion products of the semiconductor involve oxides of phosphorus, which are highly hygroscopic even at relatively low RH, then the corrosion rate would be enhanced even more than is predicted by the elimination of the resistance of the nitride alone.

This model for halo corrosion is the primary corrosion mechanism of this type of APD in an MCA. Now, we consider other mechanisms that induce heel and toe corrosion and reduce the mean time to failure. First, the presence of the wire 18 in close proximity to the top surface of the nitride layer 14 (e.g., at point 18.2 of FIG. 1) can increase the corrosion rate. One possible mechanism that we considered is electric field enhancement of the nitride due to the close proximity of the wire. This effect might have been expected to occur when the wire at the bond pad makes a very shallow angle with the surface of the device. But, the magnitude of the field added to the nitride layer turns out to be too small to account for the experimental observations. Instead we posit that electrostrictive forces play a significant role in increasing the oxidation rate of the nitride layer.

In a relatively high electric field polar molecules, such as water molecules on the surface of the nitride layer, can be displaced by electrostrictive forces. This force results in a pressure on the liquid that is proportional to the square of the average electric field at the point of interest. For a gap of 2 $\mu$m between the wire and the top surface of the nitride layer, the pressure in the water due to electrostriction is approximately 5 N/cm$^2$ (N=Newtons) or about 0.5 atmospheres. We believe that a force of this magnitude is sufficient to cause local accumulation of additional water under the wire 18, as shown in region 42 of FIG. 6. This accumulation is in addition to the water present in equilibrium with the ambient RH. The increased thickness of the water in region 42 results in higher leakage current $I_s$ on the top surface of the nitride layer 14, thereby increasing the corrosion rate. Moreover, if the increased thickness is sufficient that the water approaches bulk properties, then chemical dissolution of the nitride can occur. As discussed by J. W.; Osenbach in J. Electrochem. Soc., Vol. 140, p. 3667 (1993), this effect would increase the corrosion rate in two ways: by reducing the nitride thickness to be oxidized, and by increasing the electric field in the nitride layer, and hence the current flow through that layer. These mechanisms appear to explain the presence of heel corrosion, but may also underlie the occurrence of toe corrosion. If the bonded end of the wire 18 is smeared right up to or beyond the edge of the bond pad, then the metal is effectively thicker at that location. The greater height of the metal will result in increased electric field via fringing effects, and this increased field may locally increase the thickness of the water film by electrostriction. In addition, any smearing of the wire material beyond the bond pad will decrease the surface path length for current between the metal edge and the edge of the p-type diffused regions 12.6–12.7, thereby reducing the voltage drop on the surface path and increasing the voltage drop across the nitride layer. Either mechanism will result in increased corrosion rate near the toe.

Two other bonding-related mechanisms can be associated with heel or toe corrosion. First, damage to the nitride layer from the bonding tool may expose the underlying semiconductor to the oxidation process immediately upon application of the voltage bias in a MCA. Therefore, there would be no need in such a damaged device for the nitride layer to ever become porous by an oxidation process. Bond damage clearly will decrease the time to failure of such a device. Second, contact between the wire 18 and the nitride layer will cause the latter to suffer rapid electrical breakdown, rupturing the nitride and exposing the semiconductor to the MCA.

PREFERRED EMBODIMENTS

In accordance with one aspect of our invention, a non-hermetic, back-illuminated APD 30 (e.g., FIG. 2) includes a patterned, dielectric passivation layer 34 on its front surface that is sufficiently thick to reduce the leakage current therethrough to less than about 1 nA for voltages in the range of about 20–100 V. In a preferred embodiment, the passivation layer is a nitride layer that is at least 2 $\mu$m thick, and typically 2–5 $\mu$m thick. The increased thickness of the nitride layer reduces the electric field in and around the area where the p-n junction (not shown in FIG. 2, but similar to that of FIG. 1) intersects the top surface of the semiconductor body 32. Given that the current flowing through the nitride layer increases exponentially with the square root of the electric field, the increased thickness of the nitride layer 34 substantially reduces the leakage current flowing through it. Since the corrosion rate of the nitride layer is proportional to the current flowing through it when exposed to a MCA, the increased thickness of the nitride substantially decreases the oxidation rate of the nitride. Therefore, the lifetime and reliability of our non-hermetic APDs are expected to be increased in a MCA.

The general configuration of our APD may follow the design of FIG. 1 provided that accommodation is made, if necessary, for the increased thickness of the nitride layer. In addition, care should be exercised to provide a relatively large gap between the wire 18 in the region 18.2 and the underlying nitride layer. In addition, it would be prudent to avoid any mechanical damage to the nitride layer during the wire bonding process or any other assembly and handling process for that matter. Alternatively, if the thickness of the nitride layer makes it too difficult to form the electrode (bonding pad) 16 in the shape of a plug as shown in FIG. 1, then,. as shown in FIG. 2, the metalization 36 may be deposited only at the bottom of the opening in the nitride layer 34 and then run up onto to the top surface of the layer 34 to a bonding pad 38.

As noted earlier, single nitride layers thicker than about 0.4 $\mu$m tend to crack and so may be formed as a composite of two or more separately deposited layers. In addition, the dielectric under the bonding pad 38 can be formed of multiple layers of different materials. For example, a thick organic (e.g., polymer-based) layer 34.1 (e.g., polyamide or divinyl siloxane bis-benzocyclobutene (BCB)), or a plasma-deposited inorganic layer 34.1 (e.g., SiON, silicone nitride or SiO$_2$) may be formed between the nitride layer 34.2 and the bonding pad 38. In another embodiment, the organic layer may be covered with a hard dielectric inorganic layer 34.3: e.g., a layer of plasma-deposited SiO$_2$or silicone nitride, or a layer of ion-beam-assisted, e-beam-deposited ceramic dielectric (e.g., an Al—Ta oxide of the type described by U.K. Chakrabarti et al. in U.S. Pat. No. 5,802,091 issued on Sep. 1, 1998).

In either case, the relatively thicker dielectric layer 34 of our invention significantly reduces the vertical component of the electric field in and around the p-n junction that terminates at the top surface of the semiconductor body of the APD. If made thick enough, at least about 2 $\mu$m, the dielectric layer will essentially quench the leakage current flow through it; that is, this current will be reduced to less than about 1 nA, thereby preventing corrosion from occurring in an MCA.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

What is claimed is:

1. A non-hermetic APD that during operation has a reverse bias voltage applied thereto, comprising a semiconductor body including Group III–V compounds from the InP/InGaAsP materials system, a p-n junction formed in said body so as to intersect a top surface thereof, a patterned dielectric region formed on said surface so as to cover at least those areas where said junction intersects said surface, said dielectric region having an opening therein that exposes an underlying portion of said surface on one side of said junction, an electrode formed in said opening so as to make electrical contact to said one side of said junction, characterized in that said APD is exposed to a moisture-containing ambient, said dielectric region comprises a multiplicity of layers having a total thickness greater than about 2 μm, thereby reducing the leakage current therethrough to less than about 1 nA and inhibiting any significant oxidation of said dielectric region, and said multiplicity comprises a nitride first layer, that includes silicon and nitrogen, disposed on said surface, an organic second layer disposed on said first layer, and a hard dielectric third layer disposed on said second layer.

2. The invention of claim 1 wherein organic second layer comprises BCB.

3. The invention of claim 1 wherein said organic second layer comprises polyamide.

4. The invention of claim 1 wherein said hard dielectric layer comprises a material selected from the group consisting of plasma-deposited $SiO_2$, plasma-deposited silicon nitride, and ion-beam-assisted, e-beam-deposited ceramics.

5. The invention of claim 1 wherein said electrode fills said opening and overlaps the edges of the top surface of said dielectric layer adjacent said opening, said electrode functioning in part as a bonding pad.

6. The invention of claim 1 wherein said electrode does not fill said opening, and further including a bonding pad formed on a top surface of said dielectric layer and a conductive runner connecting said electrode to said bonding pad.

7. A back-illuminated, non-hermetic APD that during operation has a reverse bias voltage applied thereto, comprising a semiconductor body comprising Group III–V compounds from the InP/InGaAsP materials system, said body including a pair of opposite-conductivity-type InP regions forming a p-n junction that intersects a top surface of said body, and further including an undoped InGaAs light-absorbing region, a patterned dielectric region formed on said surface so as to cover at least those areas where said junction intersects said surface, said dielectric region having a first opening therein that exposes an underlying portion of said surface on one side of said junction, a first electrode formed in said first opening so as to make electrical contact to said one side of said junction, a second electrode formed on the opposite side of said body, said electrode having a second opening therein to permit ingress of light to said light-absorbing layer, and an anti-reflection coating formed in said second opening of said second electrode, characterized in that said APD is exposed to a moisture-containing ambient, said dielectric region comprises a multiplicity of layers having a total thickness greater than about 2 μm so as to reduce the leakage current therethrough to less than about 1 nA when said voltage is in the range of about 20–100 V, thereby inhibiting any significant oxidation of said silicon nitride region, and said multiplicity comprises a silicon nitride first layer disposed on said surface, a BCB second layer disposed on said first layer, and a hard dielectric, plasma-deposited silicon nitride third layer disposed on said second layer.

* * * * *